(12) United States Patent
Mayer et al.

(10) Patent No.: US 8,123,919 B2
(45) Date of Patent: *Feb. 28, 2012

(54) SPUTTERING TARGET WITH BONDING LAYER OF VARYING THICKNESS UNDER TARGET MATERIAL

(75) Inventors: Raymond M. Mayer, Canton, MI (US); Yiwei Lu, Ann Arbor, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 1438 days.

This patent is subject to a terminal disclaimer.

(21) Appl. No.: 11/229,840

(22) Filed: Sep. 20, 2005

(65) Prior Publication Data

US 2007/0062805 A1   Mar. 22, 2007

(51) Int. Cl.
*C23C 14/35* (2006.01)
(52) U.S. Cl. ......... 204/298.12; 204/298.21; 204/298.22; 204/298.13
(58) Field of Classification Search ............. 204/298.12, 204/298.13, 298.21, 298.22
See application file for complete search history.

(56) References Cited

U.S. PATENT DOCUMENTS

| | | | | |
|---|---|---|---|---|
| 4,407,713 A | * | 10/1983 | Zega | 204/298.22 |
| 5,354,446 A | * | 10/1994 | Kida et al. | 204/298.22 |
| 5,427,665 A | | 6/1995 | Hartig et al. | |
| 5,593,082 A | * | 1/1997 | Ivanov et al. | 228/122.1 |
| 5,725,746 A | | 3/1998 | Dickey et al. | |
| 6,743,343 B2 | | 6/2004 | Kida et al. | |
| 6,774,339 B1 | * | 8/2004 | Smathers et al. | 219/121.66 |
| 6,787,003 B2 | | 9/2004 | Hartig et al. | |
| 6,787,011 B2 | | 9/2004 | Ueda et al. | |
| 6,916,407 B2 | | 7/2005 | Voser et al. | |
| 7,014,741 B2 | | 3/2006 | Rietzel et al. | |
| 2004/0115362 A1 | | 6/2004 | Hartig et al. | |
| 2004/0163943 A1 | | 8/2004 | Rietzel et al. | |

FOREIGN PATENT DOCUMENTS

| EP | 0 586 809 | 3/1999 |
|---|---|---|
| JP | 7-173622 | 7/1995 |

OTHER PUBLICATIONS

U.S. Appl. No. 11/158,407, filed Jun. 22, 2005.

* cited by examiner

*Primary Examiner* — Rodney McDonald
(74) *Attorney, Agent, or Firm* — Nixon & Vanderhye P.C.

(57) ABSTRACT

Certain example embodiments of this invention relate to a rotatable magnetron sputtering target(s) for use in sputtering material(s) onto a substrate. In certain example embodiments, the target includes a cathode tube with a target material applied thereto via plasma spraying or the like. A bonding layer is provided on the tube, between the cathode tube and the target material. The bonding layer is thicker proximate at least one end portion of the target than at a central portion of the target in order to reduce the likelihood of burn-through to or of the cathode tube during sputtering.

22 Claims, 5 Drawing Sheets

SPUTTERING TARGET WITH BONDING LAYER OF VARYING THICKNESS UNDER TARGET MATERIAL

This invention relates to a target for use in sputtering (e.g., magnetron sputtering), and/or a method of making the same. In certain example embodiments, the cathode tube of the target is coated with a bonding material prior to applying the target material to the tube, where the bonding material is for the purpose of improving the bonding of the target material to the cathode tube. The thickness of the bonding material is of a greater thickness at end portion(s) of the tube than in a central portion of the tube, in order to reduce or eliminate the risk of burn-through to the tube itself during sputtering.

BACKGROUND OF THE INVENTION

Sputtering is known in the art as a technique for depositing layers or coatings onto substrates. For example, a low-emissivity (low-E) coating can be deposited onto a glass substrate by successively sputter-depositing a plurality of different layers onto the substrate. As an example, a low-E coating may include the following layers in this order: glass substrate/ $SnO_2$/ZnO/Ag/ZnO, where the Ag layer is an IR reflecting layer and the metal oxide layers are dielectric layers. In this example, one or more tin (Sn) targets may be used to sputter-deposit the base layer of $SnO_2$, one or more zinc (Zn) inclusive targets may be used to sputter-deposit the next layer of ZnO, an Ag target may be used to sputter-deposit the Ag layer, and so forth. The sputtering of each target is performed in a chamber housing a gaseous atmosphere (e.g., a mixture of Ar and O gases in the Sn and/or Zn target atmosphere(s)). In each sputtering chamber, sputtering gas discharge is maintained at a partial pressure less than atmospheric.

Example references discussing sputtering and devices used therefore include U.S. Pat. Nos. 5,427,665, 5,725,746 and 2004/0163943, the entire disclosures of which are all hereby incorporated herein by reference.

A sputtering target (e.g., cylindrical rotatable magnetron sputtering target) typically includes a cathode tube within which is a magnet array. The cathode tube is often made of stainless steel. The target material is formed on the tube by spraying, casting or pressing it onto the outer surface of the stainless steel cathode tube. Often, a bonding or backing layer is provided between the tube and the target to improve bonding of the target material to the tube. Each sputtering chamber includes one or more targets, and thus includes one or more of these cathode tubes. The cathode tube(s) may be held at a negative potential (e.g., −200 to −1500 V), and may be sputtered when rotating. When a target is rotating, ions from the sputtering gas discharge are accelerated into the target and dislodge, or sputter off, atoms of the target material. These atoms, in turn, together with the gas form the appropriate compound (e.g., tin oxide) that is directed to the substrate in order to form a thin film or layer of the same on the substrate.

There are different types of sputtering targets, such as planar magnetron and cylindrical rotatable magnetron targets. Planar magnetrons may have an array of magnets arranged in the form of a closed loop and mounted in a fixed position behind the target. A magnetic field in the formed of a closed loop is thus formed in front of the target. This field causes electrons from the discharge to be trapped in the field and travel in a pattern which creates a more intense ionization and higher sputtering rate. Since sputter is mainly performed in the zone defined by the magnetic field, a racetrack shaped erosion zone is produced as sputtering occurs. In other words, the target material is unevenly sputtered off of the target during sputtering in such planar magnetron targets.

Rotating magnetron targets, including the tube and target material, were developed to overcome erosion problems of planar magnetrons. An example conventional rotating magnetron target 10 is shown in FIG. 5, in cross section (see also U.S. Pat. No. 6,787,003, the disclosure of which is hereby incorporated herein by reference). The magnetron target 10 shown in FIG. 5 includes cathode tube 20 which may be made of stainless steel or the like, target material 30 provided on the cathode tube, and relatively thin bonding layer 40 provided on the cathode tube between and contacting the cathode tube 20 and the target material 30. The bonding layer 40 is applied at a uniform thickness along the length of tube 20, and helps insure that the target material 30 is securely adhered to the cathode tube 20. The bonding layer 40 is typically conductive and may have a coefficient of thermal expansion between that of the hollow tube 20 and the target material 30. An example material for bonding layer 40 is nickel mixed with aluminum. The target material 30 and bonding layer 40 are typically applied to the tube 20 via plasma spraying or the like.

In the case of rotating magnetrons such as that shown in cross section in FIG. 5, the cathode tube 20, bonding layer 40, and target material 30 thereon are rotated over a magnetic array (that is often stationary) that defines a sputtering zone. Due to the rotation, different portions of the target are continually presented to the sputtering zone which results in more uniform sputtering of the target material off of the tube. While rotating magnetron sputtering targets represent an improvement with respect to erosion, they can still experience uneven or non-uniform erosion of the sputtering material from the tube during sputtering—especially at the high sputtering rate areas proximate the target ends which are sometimes called turn-around areas/portions.

Unfortunately, the uneven sputtering of the target material off of the cathode tube can result in undesirable burn-through. Burning through the target material to the tube 20 would result in the sputtering of material making up the tube (e.g., stainless steel) thereby resulting in contamination of the sputtered film on the substrate. If allowed to continue, a hole could develop in the backing tube 20 which would allow cooling water from the tube interior to enter the sputtering chamber. Thus, it will be appreciated that burn-through to the tube 20 during sputtering represents a significant problem.

In view of the above, it will be appreciated that there exists a need in the art for a sputtering target constructed in a manner designed to reduce the likelihood of problematic burn-through.

BRIEF SUMMARY OF EXAMPLES OF THE INVENTION

Certain example embodiments of this invention relate to a target for use in sputtering materials onto a substrate. In certain example embodiments, the target comprises a hollow rotatable cathode tube with a bonding layer applied thereto prior to application of the target material to be sputtered onto the substrate. Thus, the bonding layer (which may be of relatively slow sputtering material in certain example embodiments) is located between the cathode tube and the target material to be sputtered, with both the bonding layer and the target material to be sputtered being supported by the cathode tube. The bonding layer is thicker at end portion(s) of the target than at a central portion of the target, so as to reduce the risk of burn-through to the tube during sputtering.

The use of the slow sputtering material of the bonding layer between the cathode tube and the material to be sputtered is advantageous in that this can reduce the risk of burn-through to or of the tube during sputtering (e.g., in the turn-around area of the target, proximate end portions of the target). In certain example embodiments, the use of the thicker slow sputtering material at end portion(s) of the target may increase the target utilization and/or lifetime of the target. The thickness of the bonding layer is greater proximate end portion(s) of the tube, compared to at a central portion of the tube, since the end portions of the target tend to be high sputtering rate areas proximate the target ends which are sometimes called turn-around areas/portions. The use of thicker bonding layer material at these end portions reduces the risk of burn-through to or of the cathode tube itself. The target material(s) to be sputtered (e.g., Sn, Zn, etc.) can be applied via plasma spraying or the like over the slow sputtering material of the bonding layer. In certain example embodiments of this invention, the bonding layer may be conductive. In certain example embodiments, the bonding layer may extend along the entire, or substantially the entire, length of the target tube, and/or is not exposed during normal sputtering operations.

In certain example embodiments of this invention, there is provided a sputtering target comprising: a rotatable cathode tube housing at least one magnet therein; a target material layer provided on the outer surface of the cathode tube; a bonding layer provided on the outer surface of the cathode tube so as to be located between the cathode tube and the target material layer; and wherein a thickness of the bonding layer is greater proximate at least one end portion of the cathode tube than at a central portion of the cathode tube.

In other example embodiments of this invention, there is provided a sputtering target comprising: a rotatable conductive tube housing at least one magnet therein; a target material layer provided on the outer surface of the tube; a bonding layer provided on the outer surface of the tube so as to be located between the tube and the target material layer; and wherein a thickness of the bonding layer is greater proximate at least one end portion of a sputtering zone of the target than at a central portion of the sputtering zone.

In other example embodiments of this invention, there is provided a sputtering target comprising: a rotatable conductive tube housing at least one magnet therein; a target material layer provided on the outer surface of the tube; at least one bonding film provided on the outer surface of the tube so as to be located between the tube and the target material layer; and wherein a thickness of the bonding layer is greater proximate at least one end portion of the target material layer than at a central portion of the target material layer.

In still further example embodiments of this invention, there is provided a sputtering target comprising: a target material layer to be sputtered, the target material layer being supported by at least a conductive rotatable tube; and wherein a thickness of the conductive rotatable tube is greater proximate at least one end portion of a sputtering zone of the target than at a central portion of the sputtering zone of the target. This may be useful in situations where only the tube is provided under the target material layer.

DETAILED DESCRIPTION OF EXAMPLE EMBODIMENTS OF THE INVENTION

Figure 1:
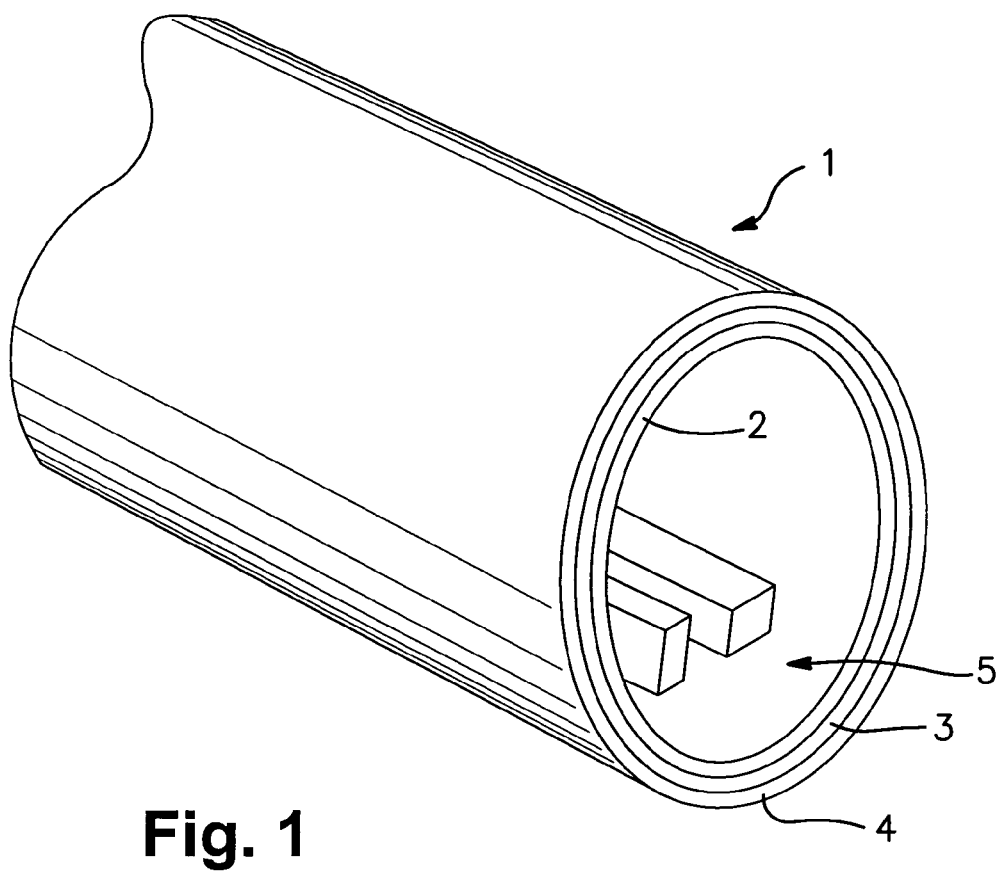
FIG. 1 is a perspective view of a rotatable magnetron sputtering target according to an example embodiment of this invention.

Referring now more particularly to the accompanying drawings in which like reference numerals indicate like parts throughout the several views.

Figure 2:
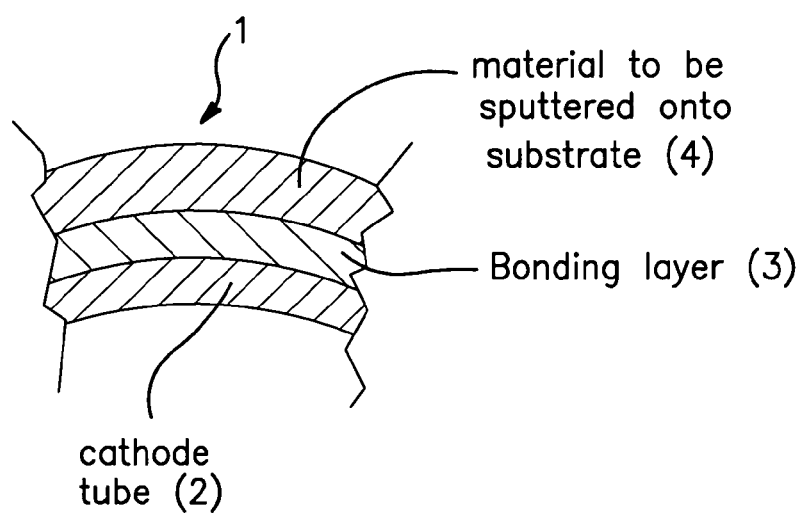
FIG. 2 is an end cross sectional view of a part of the sputtering target of FIG. 1, taken viewing the target from an end thereof.
Figure 3:
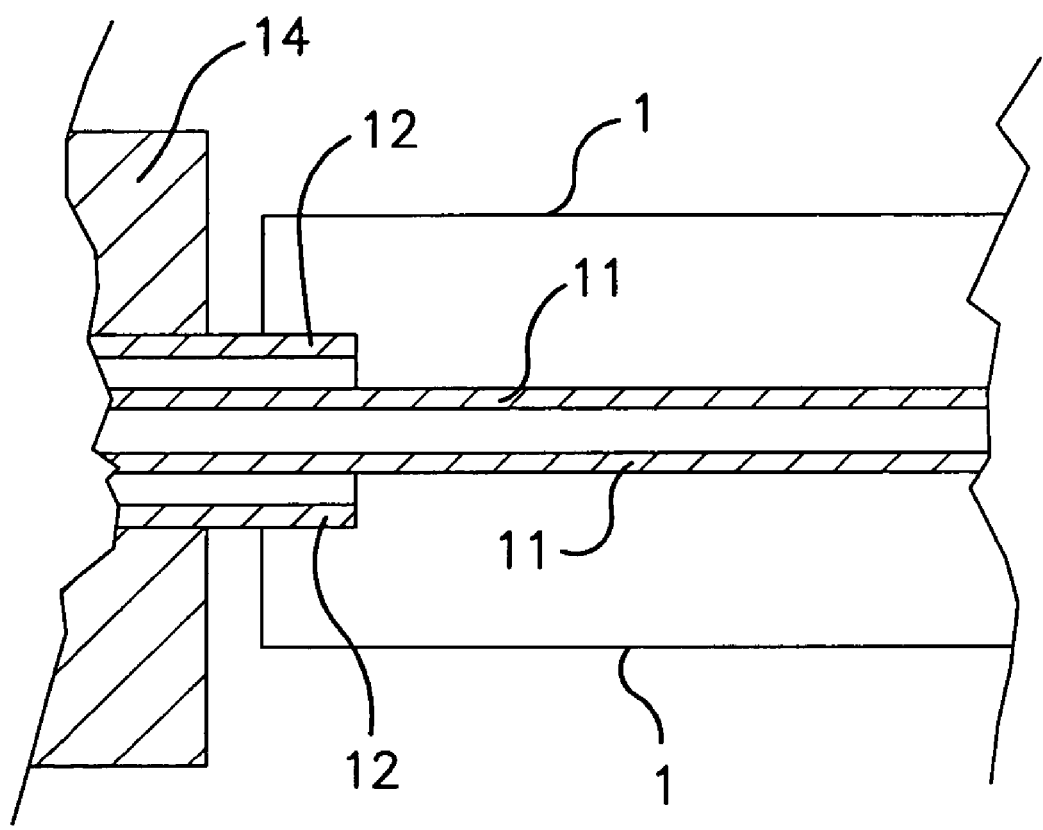
FIG. 3 is a perspective view of a sputtering apparatus using the target of FIGS. 1-2, 4 and/or 6 according to an example embodiment of this invention.
Figure 4:
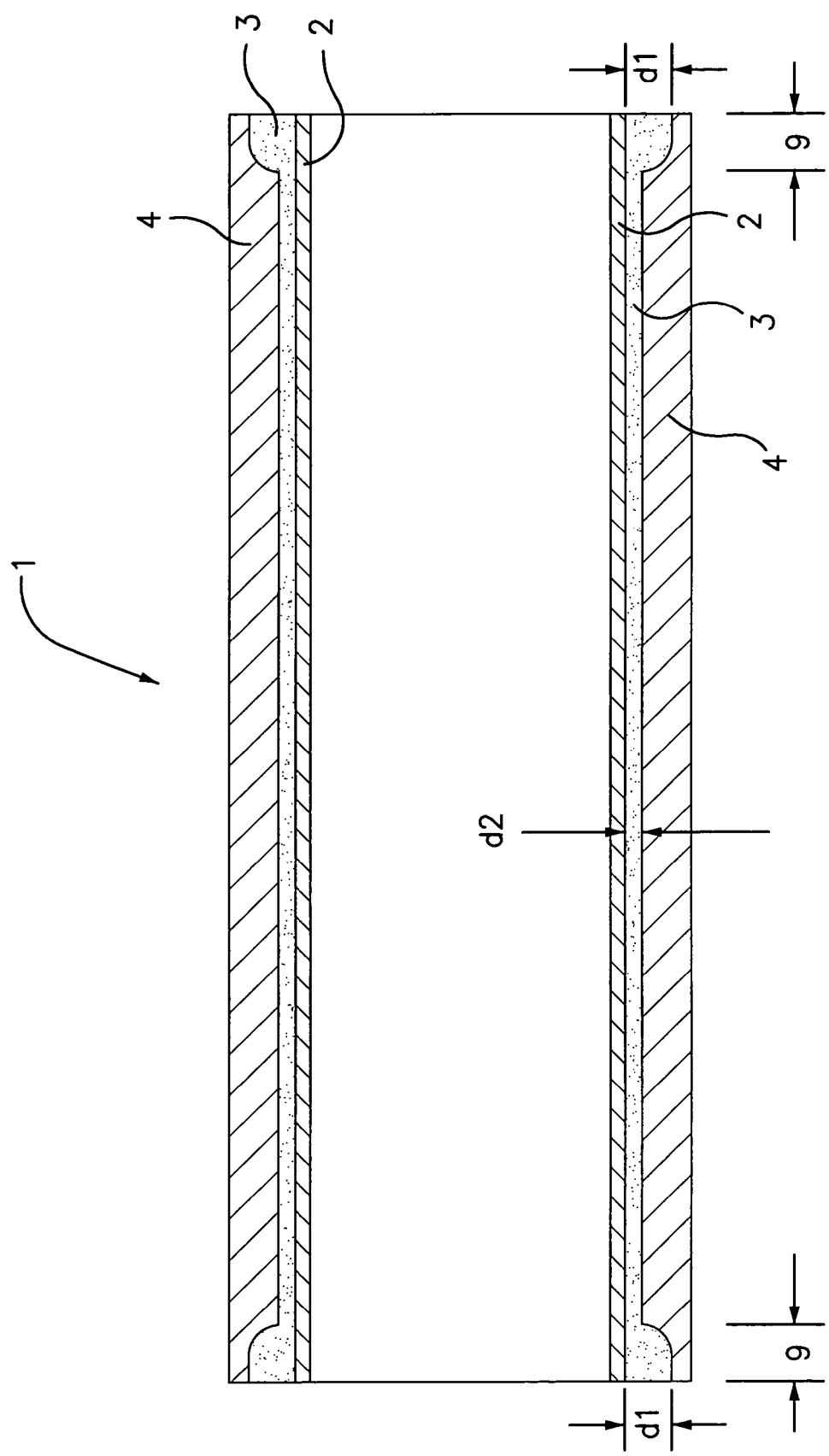
FIG. 4 is a front or rear cross sectional view of the target of FIGS. 1-3 (excluding the magnet assembly).
Figure 5:
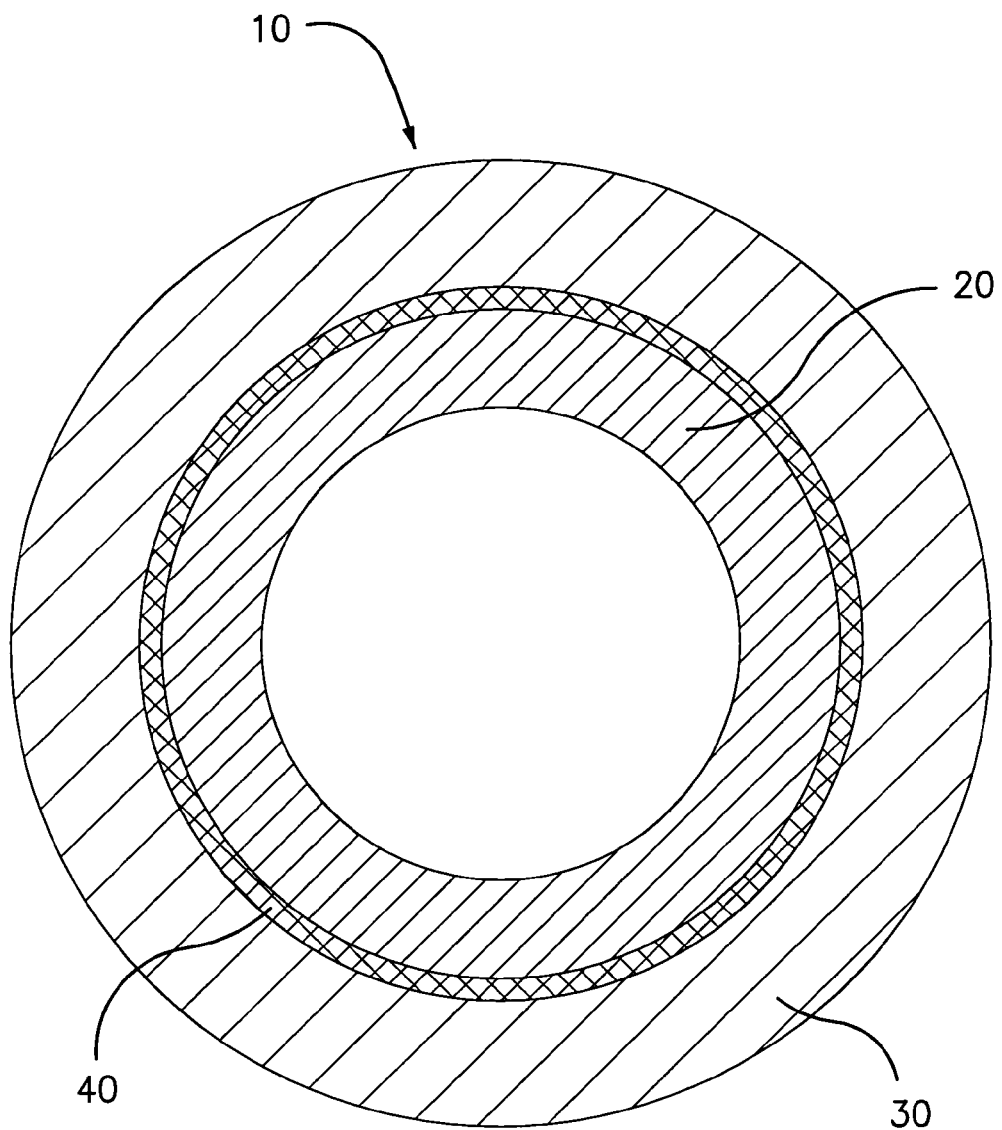
FIG. 5 is an end cross sectional view of a conventional sputtering target (excluding the magnet assembly).
Figure 6:
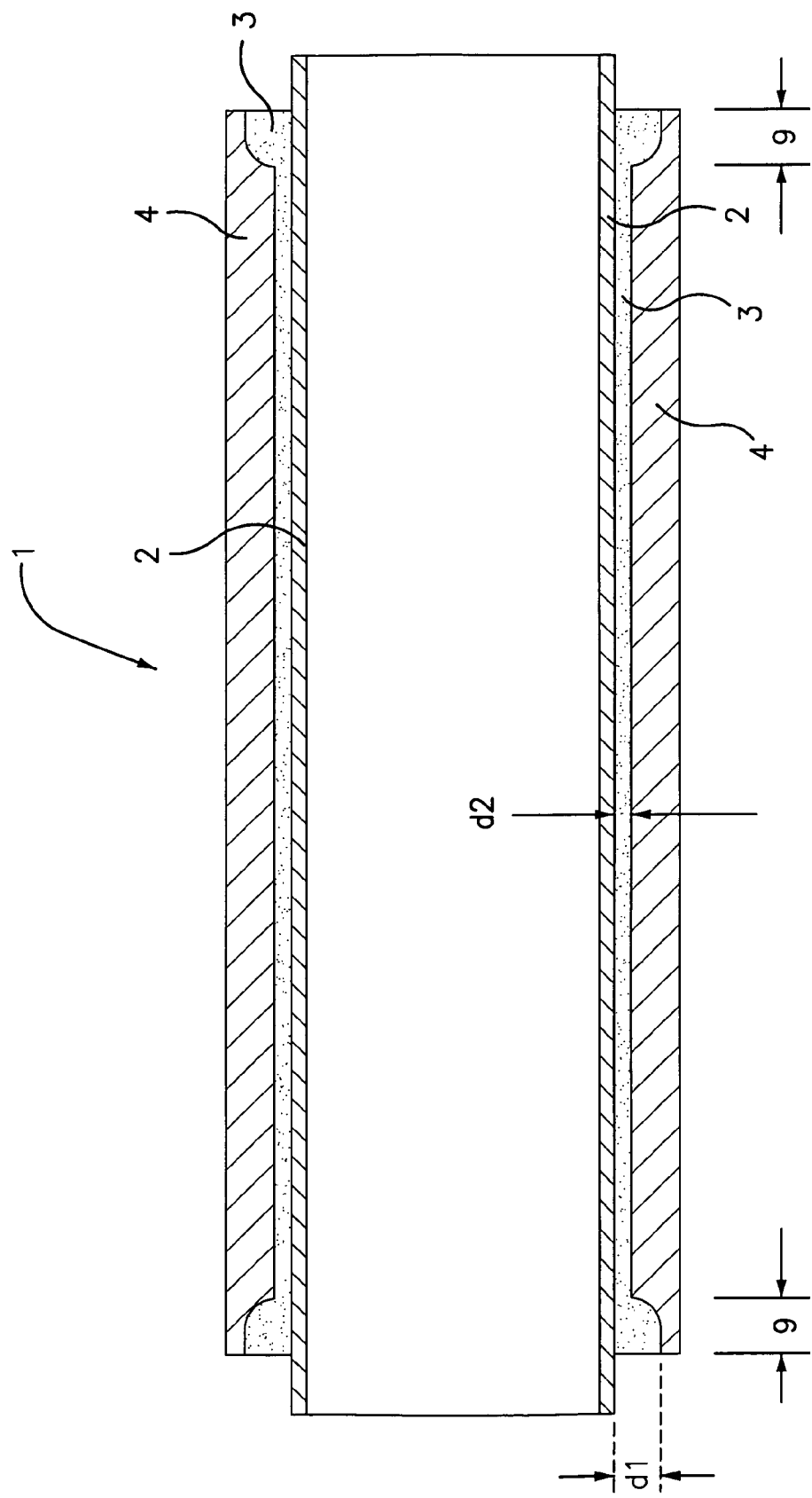
FIG. 6 is a front or rear cross sectional view of a target of FIGS. 1-3 (excluding the magnet assembly) according to another example embodiment of this invention.

FIGS. 1-4 illustrate an example sputtering target according to an example embodiment of this invention. FIG. 6 illustrates an example sputtering target according to another example embodiment of this invention, with FIGS. 1-3 being accurate representations of this target as well. The sputtering target 1 in these example embodiments are cylindrical rotatable magnetron type sputtering targets, although other types of targets may also be used. In certain example embodiments of this invention, perhaps as best shown in FIGS. 4 and 6, the thickness of the bonding layer is greater proximate at least one end portion of the target than at a central portion of the target, so as to reduce the likelihood of burn-through to or of the cathode tube during sputtering. FIG. 1 is a perspective view of an end portion of the target, FIG. 2 is an end cross sectional view of the target, FIG. 3 shows the target being used in a sputtering apparatus, and FIG. 4 is a front or rear cross sectional view of the target showing that the thickness of the bonding layer varies at different locations along the length of the target. The bonding layer is thicker in areas along the length of the target where burn-through to or of the tube is a greater risk. FIG. 6 is a cross sectional view of a target according to another example embodiment of this invention, that is similar to FIG. 4 except that the target material and bonding layers do not extend to the absolute ends of the rotatable cathode tube.

Referring now to FIGS. 1-4, an example target will be described. In certain example embodiments, the target 1 comprises a hollow rotatable cathode tube 2 with a bonding layer 3 applied thereto prior to application of the target material 4 to be sputtered onto the substrate. Thus, the bonding layer 3 (which may be of relatively slow sputtering material in certain example embodiments, compared to the target material) is located between the cathode tube 2 and the target material 4 to be sputtered, with both the bonding layer 3 and the target material 4 to be sputtered being supported by the cathode tube 2. The bonding layer 3 may be made up of a single layer or a multiple-layer film in different example embodiments of this invention.

As shown in FIG. 4, the bonding layer 3 is thicker at end portion(s) of the target than at a central portion of the target, so as to reduce the risk of burn-through to the tube during sputtering. In particular, the thickness d1 of the bonding layer 3 is greater at the end portions of the target than is the thickness d2 of the bonding layer 3 at a central portion of the target. This is advantageous in that it reduces the likelihood of burn-through to or of the tube 2 during sputtering.

In the example FIG. 4 and FIG. 6 embodiments, the thicker portion of the bonding layer 3 is provided only at the portion or area 9 of the target, which is proximate the end portion of the tube and/or target material. In certain example embodiments of this invention, the sum total of areas 9 where the bonding layer 3 is thicker does not exceed more than about 70% of the total length of the target, more preferably not more than about 60% of the total length of the target, and most preferably not more than about 20% of the total length of the target, and sometimes no more than about 10% of the total length of the target. In other non-illustrated example embodiments of this invention, the thicker areas 9 of the bonding layer may extend further inwardly toward the central area of the target than shown in FIGS. 4 and 6, and/or may be located in other areas of the target.

In certain example embodiments of this invention, tube 2 rotates in a known manner along with the bonding layer 3 and target material 4 bonded thereto. In certain example embodiments, the hollow cathode tube 2 may be of a conductive material such as stainless steel or the like. Any suitable conductive material may be useful as cathode tube 2. The bonding layer 3 is also conductive in certain example embodiments of this invention, although it need not be. In certain example embodiments of this invention, the bonding layer 3 may be of or include Mo, Nb, and/or an alloy of one or both of these materials. In other example embodiments of this invention, the bonding layer 3 may be of or include Ni, an alloy thereof such as NiAl, or the like. Other conductive or non-conductive materials may also be used for the bonding layer, so long as they provide good bonding of the target material 4 to the tube 2. In certain example embodiments of this invention, the target material 4 is of a material to be sputtered-onto a substrate (e.g., glass substrate, semiconductor substrate, or the like), and may be of or include Sn, Zn, Ti, alloys thereof, or the like. In certain example embodiments, the thickness of the target material layer 4 is from about 3 to 25 mm, more preferably from about 6 to 16 mm. In certain example embodiments (e.g., see FIGS. 4, 6), the target material 4 may be thinner in areas over the thick portions of the bonding layer 3; however, in certain preferred embodiments of this invention the target material 4 is conformal to the bonding layer 3 and thus has a substantially uniform thickness across the length of the sputtering zone of the target.

In certain example embodiments of this invention, the material of the bonding layer 3 may have a slower sputtering rate than the target material 4. The use of the slow sputtering material of the bonding layer 3 between the cathode tube 2 and the material 4 to be sputtered is advantageous in that this can reduce the risk of burn-through to or of the tube 2 during sputtering (e.g., in the turn-around area of the target, proximate end portions of the target). In certain example embodiments, the use of the thicker slow sputtering material 3 at end portion(s) of the target may increase the target utilization and/or lifetime of the target. In this respect, as explained above, the thickness of the bonding layer 3 is greater proximate end portion(s) of the tube, compared to at a central portion of the tube, since the end portions of the target tend to be high sputtering rate areas proximate the target ends which are sometimes called turn-around areas/portions.

The target material(s) 4 to be sputtered can be applied via plasma spraying or the like over the slow sputtering material of the bonding layer 3. Likewise, the bonding layer 3 can also be applied to the tube 2 by plasma spraying or in any other suitable manner. In certain example embodiments, the bonding layer 3 may extend along the entire, or substantially the entire, length of the target tube 2 (see FIGS. 4 and 6), and/or is not exposed during normal sputtering operations.

FIG. 6 is a cross sectional view of a rotatable magnetron sputtering target according to another example embodiment of this invention. The FIG. 6 embodiment is similar to the FIG. 4 embodiment, except that the tube 2 in FIG. 6 extends lengthwise beyond the end of the bonding layer 3 and the target material 4. However, in the FIG. 6 embodiment, the thickness of the bonding layer 3 is still greater proximate the end portions of the target than at a central portion of the target, so as to reduce the likelihood of burn-through to or of the cathode tube during sputtering, even though the tube 2 extends slightly beyond the end of the bonding layer 3. Extending the tube 2 beyond the end of the bonding layer 3 as in FIG. 6 may be useful for mounting purposes in certain example embodiments of this invention, and the exposed tube 2 areas that extend beyond the end of layers 3, 4 need not be in the actual sputtering zone where material is sputtered from the target (e.g., the extensions of tube 2 may be beyond the magnet bar areas). Moreover, as in the FIG. 4 embodiment, the thicker areas of the bonding layer 3 in the FIG. 6 embodiment are located proximate the end portions of the sputtering zone of the target.

Referring especially to FIG. 1, the provision of magnet array 5, which is typically stationary even when the tube 2 (and layers 3, 4 thereon) is rotating, inside the tube 2 causes the target material 4 to be sputtered unevenly in certain areas—especially proximate end portions of the sputtering zone which is defined by the magnetic field formed by the magnet(s). This uneven sputtering can result in burn-through, for example in an area where the sputtering rate of the target material is unusually fast, such as at end portions of the sputtering zone of the target. The provision of thicker material 3 in such areas is designed to prevent or reduce the likelihood of such burn-through.

In other example embodiments of this invention, an alternative is to utilize the slow sputtering material 3 as the material for making the cathode tube 2. In such an embodiment, the cathode tube 2 would not be made of stainless steel, but instead would be made of a slow sputter material of the bonding layer such as Mo, Ti, W, Nb, Ni, Ta, or the like. In such embodiments, the layer 3 would still be thicker proximate end portions of the sputtering zone and/or target than at a central portion thereof in order to reduce the likelihood of burning through the thickness of the tube. In either case, target materials 4 to be sputtered can be applied over the slow sputtering material 3. When the target material 4 to be sputtered has been consumed by sputtering, especially in the turn-around region of the cathode, the slow sputtering material can protect the target tube from burn-through. In certain example embodiments, the slow sputtering material may extend along the entire, or substantially the entire, length of the target tube 2, and/or is not exposed during normal sputtering operations.

FIG. 3 is a cross sectional view of a sputtering apparatus that can use the target 1 of FIGS. 1-2, 4 or 6. The sputtering apparatus includes cooling tubes 11, 12 through which cooling fluid (e.g., water) flows in order to cool the target and/or magnets during sputtering operations. The target 1 is rotatably mounted to support 14 so that during sputtering operations the target 1 rotates relative to the support 14. Shields (not shown) may also be provided in a known manner.

In alternative example embodiments of this invention, the slow sputtering material need not be the bonding layer materials, but may be other materials and/or an additional layer(s).

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

The invention claimed is:

1. A sputtering target comprising:
a rotatable cathode tube housing at least one magnet therein;
a target material layer provided on the outer surface of the cathode tube;
a bonding layer provided on the outer surface of the cathode tube so as to be located between the cathode tube and the target material layer; and
wherein a thickness of the bonding layer is greater proximate at least one end portion of the cathode tube than at a central portion of the cathode tube.

2. The sputtering target of claim 1, wherein the bonding layer is a slow sputtering layer that has a sputter rate less than that of the target material layer.

3. The sputtering target of claim 1, wherein each of the cathode tube and the bonding layer are electrically conductive.

4. The sputtering target of claim 1, wherein the cathode tube is made of stainless steel, and wherein areas where the bonding layer is thicker are present in areas not exceeding about 20% of the total length of the target.

5. The sputtering target of claim 1, wherein the target material layer comprises one or more of Sn and Zn.

6. The sputtering target of claim 1, wherein the bonding layer comprises one or more of Mo, Ni, Ti, W, Nb and Ta.

7. The sputtering target of claim 1, wherein the bonding layer directly contacts each of the cathode tube and the target material layer.

8. The sputtering target of claim 1, wherein the thickness of the bonding layer is greater proximate both end portions of the cathode tube than at a central portion of the cathode tube.

9. The sputtering target of claim 1, wherein the bonding layer is not exposed to sputtering ions during normal sputtering operations since it is adapted to be covered by at least the target material layer.

10. A sputtering target comprising:
a rotatable conductive tube housing at least one magnet therein;
a target material layer provided on the outer surface of the tube;
a bonding layer provided on the outer surface of the tube so as to be located between the tube and the target material layer; and
wherein a thickness of the bonding layer is greater proximate at least one end portion of a sputtering zone of the target than at a central portion of the sputtering zone.

11. The sputtering target of claim 10, wherein the bonding layer is a slow sputtering layer that has a sputter rate less than that of the target material layer.

12. The sputtering target of claim 10, wherein each of the tube and the bonding layer are electrically conductive.

13. The sputtering target of claim 10, wherein the tube is made of stainless steel.

14. The sputtering target of claim 10, wherein the target material layer comprises one or more of Sn and Zn, and wherein the tube is a cathode tube.

15. The sputtering target of claim 10, wherein the bonding layer comprises one or more of Mo, Ni, Ti, W, Nb and Ta.

16. The sputtering target of claim 10, wherein the bonding layer directly contacts each of the tube and the target material layer.

17. The sputtering target of claim 10, wherein the thickness of the bonding layer is greater proximate both end portions of the sputtering zone than at a central portion of the sputtering zone.

18. The sputtering target of claim 10, wherein the bonding layer is not exposed to sputtering ions during normal sputtering operations since it is adapted to be covered by at least the target material layer.

19. A sputtering target comprising:
a rotatable conductive tube housing at least one magnet therein;
a target material layer provided on the outer surface of the tube;
at least one bonding film provided on the outer surface of the tube so as to be located between the tube and the target material layer; and
wherein a thickness of the bonding layer is greater proximate at least one end portion of the target material layer than at a central portion of the target material layer.

20. The sputtering target of claim 1, wherein the rotatable cathode tube has a substantially uniform thickness proximate to the at least one end portion where the thickness of the bonding layer is greater, and wherein the bonding layer is provided around an entire circumference of the cathode tube and is also provided along substantially an entire length of the cathode tube.

21. The sputtering target of claim 10, wherein the rotatable conductive tube has a substantially uniform thickness proximate to the at least one end portion where the thickness of the bonding layer is greater, and wherein the bonding layer is provided around an entire circumference of the cathode tube and is also provided along substantially an entire length of the cathode tube.

22. The sputtering target of claim 19, wherein the rotatable conductive tube has a substantially uniform thickness proximate to the at least one end portion where the thickness of the bonding layer is greater, and wherein the bonding layer is provided around an entire circumference of the cathode tube and is also provided along substantially an entire length of the cathode tube.

* * * * *